(12) United States Patent
Takayama

(10) Patent No.: US 6,169,603 B1
(45) Date of Patent: Jan. 2, 2001

(54) COMPACT RETICLE INSPECTION SYSTEM CAPABLE OF INSPECTING A RETICLE WITH HIGH ACCURACY AND METHOD OF INSPECTING THE SAME

(75) Inventor: Naohisa Takayama, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/199,477

(22) Filed: Nov. 25, 1998

(30) Foreign Application Priority Data

Nov. 25, 1997 (JP) .................................................... 9-323264

(51) Int. Cl.[7] ....................................................... G01B 9/02
(52) U.S. Cl. ............................................. 356/500; 356/517
(58) Field of Search ..................................... 356/358, 363

(56) References Cited

U.S. PATENT DOCUMENTS 4,950,079 * 8/1990 McMurtry et al. .................. 356/358

* cited by examiner

Primary Examiner—Robert Kim
Assistant Examiner—Andrew H. Lee
(74) Attorney, Agent, or Firm—Foley & Lardner

(57) ABSTRACT

Even though a laser interferometer is affected by the changes in the environment, a reticle can be inspected with a high accuracy by synthesizing a reference image corrected appropriately to compare with an optical image. The reticle which a pattern is plotted in advance is irradiated with a light beam to obtain the optical image from the transmitted light to compare the optical image with the reference image synthesized by converting draft data used at plotting said pattern and to detect defects of the pattern. The reference image is corrected based on the deviation data obtained at the preceding pattern defect detection. The deviation data is the difference between a difference (an initial distance value) between a completion position data and an initiation position data measured before a laser interferometer is affected by the changes in the environment and a difference (a distance data) between the completion position data and the initiation position data measured after being affected by the changes in the environment, and is obtained using a scale is hardly affected by the changes in the environment.

10 Claims, 6 Drawing Sheets

COMPACT RETICLE INSPECTION SYSTEM CAPABLE OF INSPECTING A RETICLE WITH HIGH ACCURACY AND METHOD OF INSPECTING THE SAME

BACKGROUND OF THE INVENTION

The present invention relates to a reticle inspection system and a method of inspecting a reticle used for forming a predetermined pattern on a semiconductor wafer.

Conventionally, in a manufacturing process of a Large Scale Integration(LSI) circuit, a reticle is used for forming the predetermined pattern on the semiconductor wafer constituted by a silicon or the like. The pattern is formed on the semiconductor wafer by exposing the semiconductor wafer to a light through the reticle and an optical lens. Therefore, when the reticle has a pattern defect in itself, the defective pattern is transferred on all the wafers manufactured by using the reticle. As a results a large amount of defective LSI circuits are manufactured. Accordingly, the pattern inspection of the reticle is very important and essential for manufacturing LSI circuits. Moreover, since the more fine pattern has come to be formed in recent years, a high accuracy inspection of a defect detecting sensitivity of less than 0.2 $\mu$m is required in a reticle inspection system.

In inspection methods of the reticle for manufacturing LSI circuits, there are two kinds of the methods. One is a die-to-die inspection method for comparing identical patterns formed at different positions on the same reticle to each other while another is a die-to-database inspection method for comparing draft data used when plotting the reticle pattern with the pattern on the actual reticle. Herein, "die" means a certain grouping of pattern areas or the detection image thereof, which is defined as a unit of a pattern comparison inspection. Further, "database" means a reference image synthesized from the draft data with respect to an actual pattern image detected by an optical system.

Conventionally, an ordinarily reticle inspection system comprises an X-Y stage for setting a reticle, a laser interferometer for detecting a position of the X-Y stage with a high accuracy, a laser-scanning optical-device for scanning a laser beam in the direction of the Y-axis of the reticle, a transmitted-light detection section for detecting the transmitted light, an optical image input section for receiving an optical image from the transmitted-light detection section, a data conversion section for converting the draft data used where plotting the reticle to synthesize the reference image, an image comparison section for comparing the optical image with the reference image to detect a pattern defect, and a controller for controlling the entire system.

However, via a conventional method of inspecting a reticle using the ordinarily reticle inspection system, it takes several hours to detent one sheet of the reticle. Therefore, error is inevitably caused to occur in detection of the travel of the X-Y stage by the laser interferometer due to changes of environment (temperature, humidity, atmospheric pressure) during inspection. When the error is included in the detected results by the laser interferometer, the X-Y stage cannot be made to travel correctly by a certain pitch. Consequently, a deviation is generated between the optical image and the reference image, even though the reticle has actually no defect in the pattern thereof.

In order to avoid this problem, it is considered that the entire reticle inspection system is placed in an temperature control chamber to hold the air flow constant as well as to hold the temperature and the humidity constant. In addition, a wavelength compensator (a correcting means) is provided foot detecting the change in a refractive index in the vicinity of the optical path of the laser interferometer. Thereby, an effective refractive index is calculated to correct the reference image in. real time. Accordingly, the optical image is compared with the reference image corrected in real time. In the wavelength compensator, a wavelength in an actual environment is compared with that in vacuum by the use of a vacuum tube with a certain distance to detect the change in a refractive index and to correct it. However, this method requires a very large temperature control chamber surrounding the entire system and the wavelength compensator. The method therefore brings disadvantages in that the system becomes large in size and very expensive.

SUMMARY OF THE INVENTION

Therefore, it is an object of the present invention to provide a reticle inspection system and a method of inspecting a reticle in which the reticle car be inspected with a high accuracy, by synthesizing the reference image corrected appropriately to compare with the optical image, even in the case that the laser interferometer is subjected to the influence of changes in the environment.

Other objects of the present invention will become clear as the description proceeds.

According to an aspect of the present invention, there is provided a method of inspecting a reticle comprising the steps of: irradiating a light bean on a reticle having a pattern in advance to receive the transmitted light and to form an optical image, while measuring the relative position of the X-Y table placing the reticle by a laser interferometer; comparing the optical image with a reference image synthesized by converting draft data used when forming the pattern; and detecting defects of the pattern. The method further comprising the steps of: providing a scale to which changes in an environmental condition is less than that of the laser interferometer and detecting the position of the X-Y table; obtaining deviation data of measurement errors of the laser interferometer due to the changes in the environmental condition using the scale; and synthesizing the reference image which is corrected from the draft data by the amount of the deviation data. Therefore, a visual inspection of the reticle can be performed accurately corresponding to the changes in the environmental condition.

More particularly, the deviation data is calculated by: storing position data of the laser interferometer and the scale in a light-beam irradiating initiation position to the reticle, and position data of the laser interferometer and the scale in a light-beams irradiating completion position; obtaining in advance an initial distance value of the difference between the position data of the laser interferometer in the light-beam irradiating completion position and the position data of the laser interferometer in the light-beam irradiating initiation position; moving the X-Y table, placing the reticle of an inspection object so that the position data detected by the scale matches with the stored position data of the light-beam irradiating initiation position stored to store the initiation position data of the laser interferometer at that time; subsequently, initiating the light-beam irradiation to the reticle while moving the X-Y table; storing the completion position data of the laser interferometer at that time as well as stopping the light-beam irradiating, at the time ill which the position data detected by the scale reaches a position matching with the position data of the light-beam irradiating completion position; and calculating a distance data of the difference between the completion position data of the laser interferometer and the initiation position data of the laser interferometer to obtain the difference between the distance data and the initial distance value.

Moreover, the laser interferometer cancels vibration difference in phase between a lens of the laser-scanning optical system irradiating the light beam and the X-Y table. Thus, both the effects can be obtained using in combination of the laser interferometer and the scale.

The detection of the defects in the pattern in a plurality of points of the reticle is performed sequentially, and when, in a reference image synthesizing process, the correction is designed to be performed based on the deviation data obtained at the preceding detection of the defect, the synthesis of the reference image is efficiently corrected corresponding to the changes in the environment.

According to another aspect of the present invention, there is provided a reticle inspection system comprising: an X-Y table for carrying a reticle on which the pattern is plotted in advance; a light bean-scanning optical system for irradiating on the reticle a light beam; a laser interferometer for measuring a relative position of the X-Y table, a scale to which an influence of changes in the environment is less than that of the laser interferometer, and for measuring the position of the X-Y table; a transmitted-light detection section for obtaining an optical image based on the, transmitted light of the light beam which is irradiated on the reticle; a data conversion section for obtaining the deviation data of a measurement error due to the changes in the environment of the laser interferometer using the scale, to synthesize the reference image corrected by the deviation data from draft data used when plotting the pattern; and an image comparison section for comparing the optical image with the reference image to detect defects of the pattern.

The deviation data is the difference between an initial distance value of the difference between a completion position data and an initiation position data measured before the laser interferometer is affected by the changes in the environment and the distance data of the difference between the completion position data and the initiation position data measured after the laser interferometer is affected by the changes in the environment.

Moreover, the scale is a laser scale and the light beam is the laser beam.

DESCRIPTION OF THE PREFERRED EMBODIMENT

Figure 1:
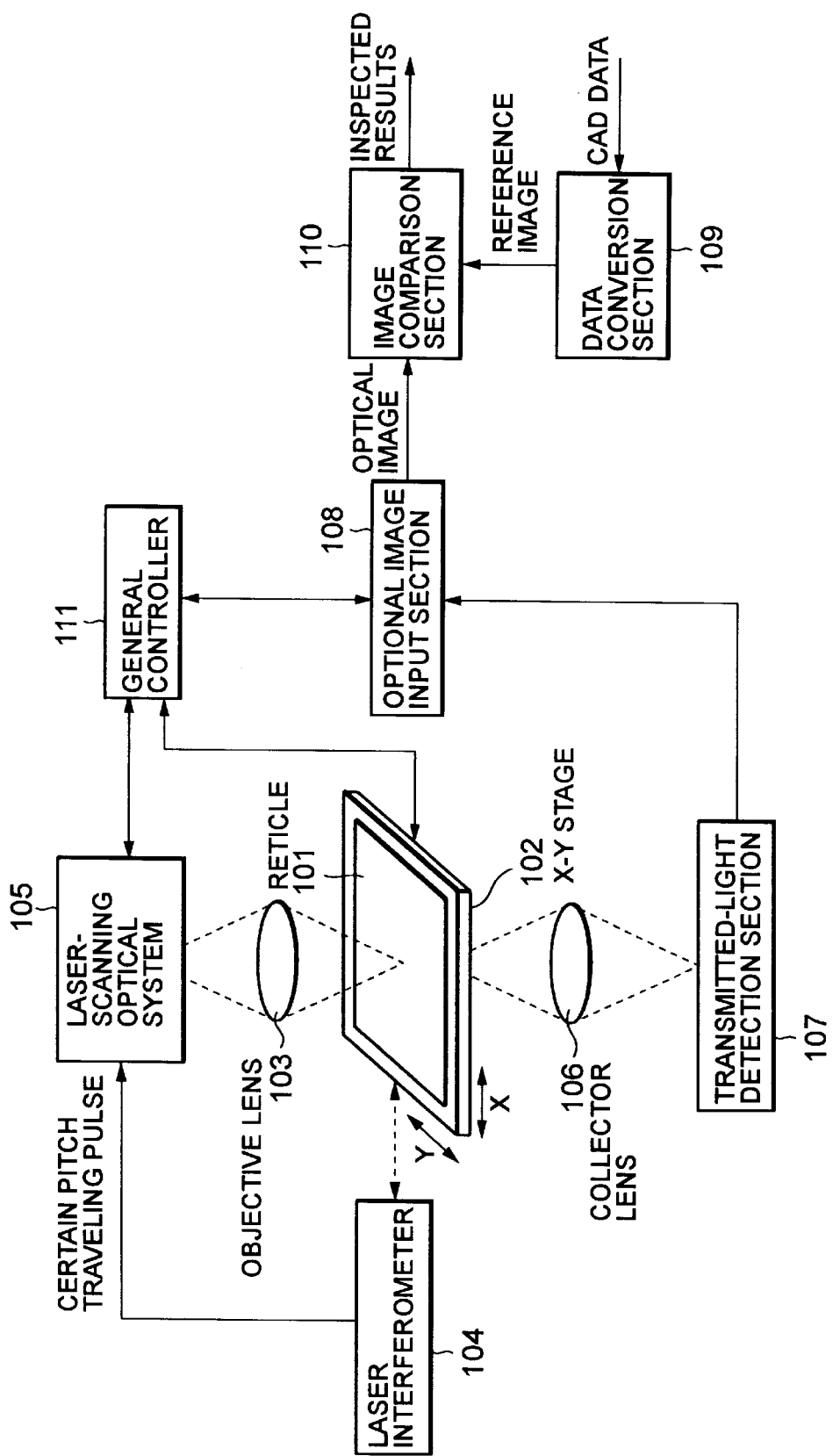
FIG. 1 is a block diagram for showing a constitution of a conventional reticle inspection system.

Referring to FIG. 1, description is, at first, made about a conventional reticle inspection system and a method using the conventional reticle inspection system for a better understanding of the present invention.

FIG. 1 is a block diagram for showing a constitution of the conventional reticle inspection system. The conventional reticle inspection system has a structure similar to that of the ordinary one mentioned in the preamble of the instant specification. However, in order to facilitate an understanding of the problem in a reticle inspection method using the conventional system, the constitution of the conventional reticle inspection system is described again with reference numerals.

As illustrated in FIG. 1, the conventional reticle inspection system comprises an X-Y stage 102 for setting a reticle 101, a laser interferometer 104 for detecting a position of the X-Y stage with a high accuracy, a laser scanning optical system 105 for scanning a laser beam in the direction of the Y-axis of the reticle 101, a transmitted light detection section 107 for detecting the transmitted light, an optical image input section 108 for receiving an optical image from the transmitted light detection section 107, a data conversion section 109 for converting the draft data used when plotting the reticle to synthesize the reference image, an image comparison section 110 for comparing the optical image with the reference image to detect a pattern defect, and a controller 111 for controlling the entire system.

Herein, description is made as regards a method of inspecting a reticle using the conventional reticle inspection system by the above-mentioned die-to-database inspection method. The defects on the entire reticle are detected by dividing, at first, the reticle 101 into a plurality of inspection regions slightly overlapping each other to inspect every each inspection region sequentially, at last, to integrate the defects in each region. The inspection in each inspection region is performed as follows. First, the X-Y stage 102 places the reticle 101 at an inspection initiation position or the associated inspection region. Second, the X-Y stage 102 is fed in the direction of the X-axis, while monitoring with the laser interferometer 104, to scan the laser beam by the laser scanning optical system 105 in the direction of the Y-axis every time it travels by a certain pitch. Then, the transmitted light is detected by the transmitted light detection section 107 to receive the two-dimensional image every one frame. The received optical image is transferred from the optical image input section 108 to the image comparison section 110. In the image comparison section 110, the received optical image is compared with the reference image synthesized in the data conversion section 109 to detect dissimilarities (the defects). Moreover a "frame" is a unit representing, the which may be simultaneously processed by the images; comparison section 110 (refer to FIG. 3).

However, in the method of inspecting a reticle using the conventional reticle inspection system, it takes several hours to detect one sheet of the reticle 101. Therefore, error is inevitably caused to occur in detection of the travel of the X-Y stage 102 by the laser interferometer 104 due to changes of environment (temperature, humidity, atmospheric pressure) during inspection. When the error is included in the detected results by the laser interferometer 104, the X-Y stage 102 cannot be made to travel correctly by a certain pitch. Consequently, a deviation is generated between the optical image and the reference image, even though the reticle 101 has actually no defect in the pattern thereof. Namely, even though, both images are approximately matched in the initial frame of the inspection region, as one increases the number of frames, the minute errors of a traveling patch of the X-Y stage 102 are accumulated. Thereby the amount of the deviation between the optical image and the reference image is increased, so that it appears as a magnified deviation in the inspection region inspected at the final process.

These errors are caused because the refractive index of the air in an optical path of the laser interferometer 104 is varied due to changes in the environment, and because the wavelength of the laser emitted from the laser interferometer 104 is changed accordingly. For example, with the laser interferometer made of Zygo Co., Ltd. having resolution of 1024, the factors of an effective distance card a refractive index with respect to each change in the environment is as follows.

An effective distance=(a reading value of the interferometer×a wavelength of the laser in a vacuum)/ (1024×a refractive index)

A ratio of change in a refractive index for temperature: 1 [PPM/%]

A ratio of change in a refractive index for humidity: 0.01 [PPM/%]

A ratio of change in a refractive index for atmospheric pressure: 0.357 [PPM/%]

For example, in the case of measuring the distance of 100 $\mu$m, the error becomes 0.1 $\mu$m when the refractive index is changed by 1 PPM. The factor which especially influences upon a refractive index is changes of atmospheric pressure. It can sometimes change by approximately 50 mmHg for a time period of several hours, resulting in an error in this case of up to approximately 1.8 $\mu$m. In the reticle inspection system in which the accuracy of approximately 0.1 $\mu$m in inspection resolution is required, this error is not a negligible dimension and it appears as a large deviation between the optical image and the reference image.

Referring now to FIGS. 2 through 6, description will proceed to a reticle inspection system and a method of inspecting a reticle according to a preferred embodiment of the present invention.

Figure 2:
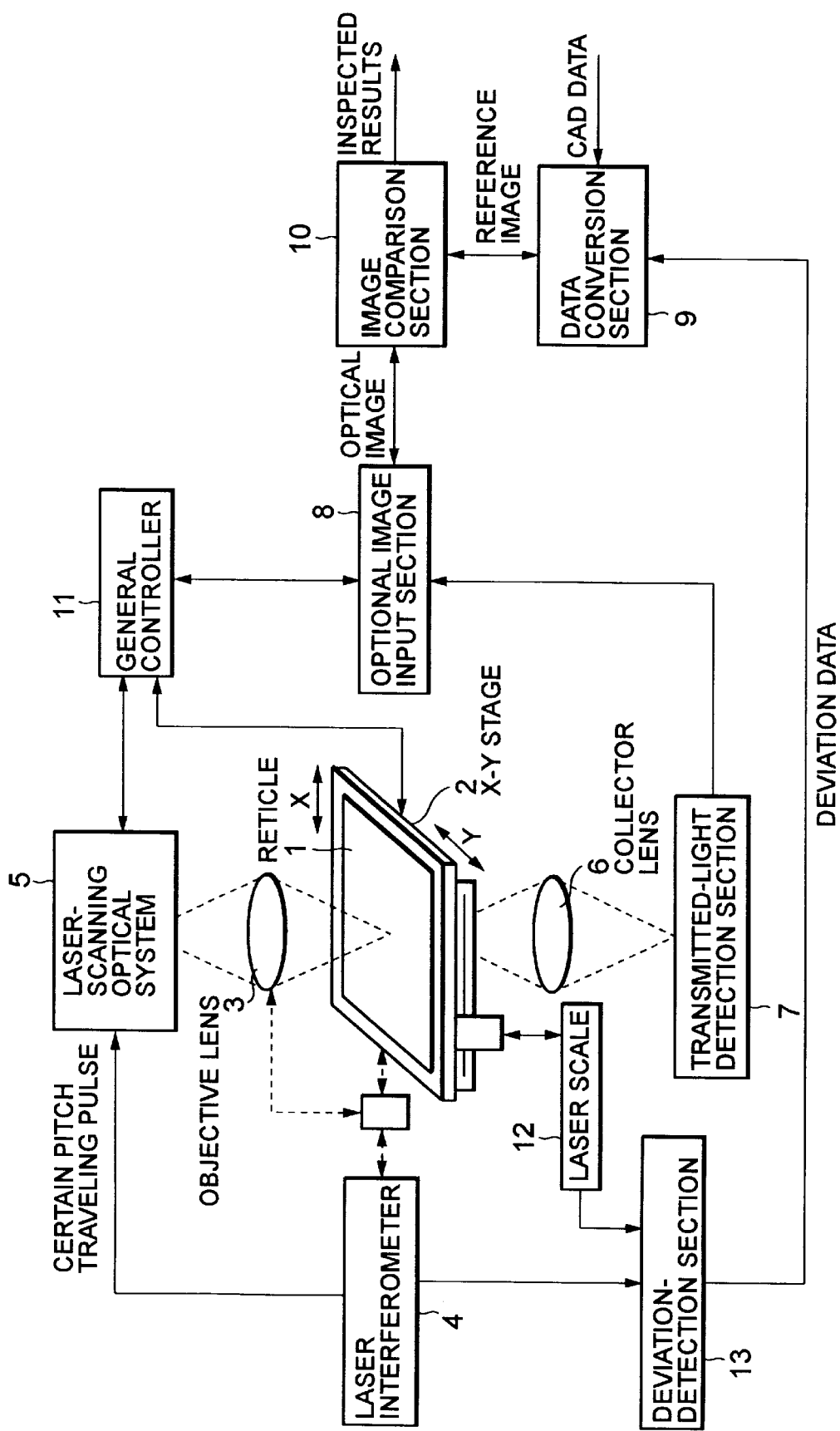
FIG. 2 is a block diagram for showing a reticle inspection system according to a preferred embodiment of the present invention.

FIG. 2 is a block diagram for showing a constitution of a reticle inspection system according to the embodiment. first, each component constituting the reticle inspection system according to this embodiment will be described. A reticle 1 is set on the upper surface of an X-Y stage 2 and is movable in the direction of the X- and the Y-axis by a driving mechanism (not shown). A laser interferometer 4 detects a relative position in the direction of the x-axis of the X-Y stage accurately using a laser. A laser scanning optical system (a light-beat scanning optical system) 5 scans a laser beam (a light beam) through an objective lens 3 in the direction of the Y-axis. A transmitted light detection section 7 detects the transmitted light of the laser bean collected through a collector lens 6 to obtain the optical image from this transmitted light. The optical image is entered to an optical image input section 8 from the transmitted light detection section 7. A data conversion section 9 converts the draft data used at plotting the reticle to synthesize the reference image. An image comparison section 10 compares the optical image entered from the optical image input section 8 with the reference image entered from the data conversion section 9 to detect a pattern defect. A in controller 11 controls entire operations of this inspection system. A respective position data is entered to a deviation detection section 13 from the lasers interferometer 4 and a laser scale 12 described below, and the deviation detection section 13 compares both data to obtain the deviation.

The laser scale 12 is one for detecting a absolute position in the direction of the X-axis of the X-Y stage 2 and is hardly affected by the changes in the environment. Specifically, the laser scale 12 is one which is formed in a manner of sandwiching a hologram grid prepared by means of the laser light between two sheets of quartz plates, and is one constituted by using the phenomenon that the phase of the diffracted light through the hologram grid is changed when moving the grid then irradiating the laser light. Such a device is hardly affected by changes in the environment and is inexpensive since the a repeat accuracy is high and the optical path of the laser light can be shortened.

For example, the specification of the laser scale made of Sonny Precision Technology Co., Ltd. is as follows;

Repeat accuracy: 0.02 $\mu$m

A temperature coefficient: −0.7 PPM/deg. (mainly due to thermal expansion of glass)

A humidity coefficient and a atmospheric pressure coefficient are considerably small as compared with a temperature coefficient.

In a clean room in which such reticle inspection system is commonly set up, changes of an environment temperature are within the range of approximately ±1 deg. With such degree of temperature change, the error in the laser scale becomes only approximately ±0.07 $\mu$m for the measurement of 100 mm at the maximum. Especially, with respect to changes in a atmospheric pressure and a humidity, the error becomes negligible small, whereby it shows superior resistance to the changes in the environment as compared with the laser interferometer 4 or the like.

Next, referring to FIGS. 3 to 6, description proceeds to a reticle inspection method according to this embodiment.

Figure 3:
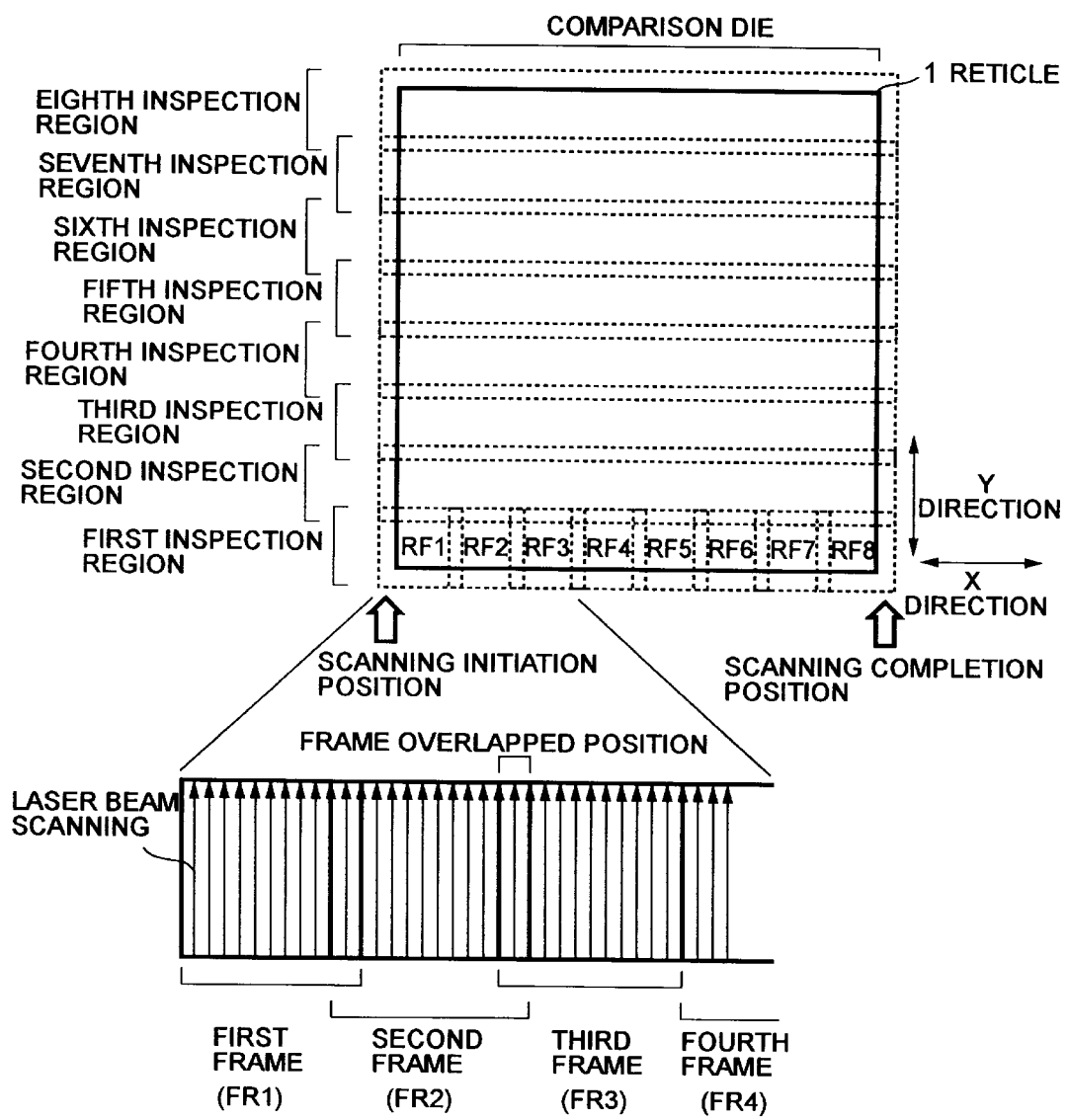
FIG. 3 is an illustration of a die-to-database inspection method.
Figure 4:
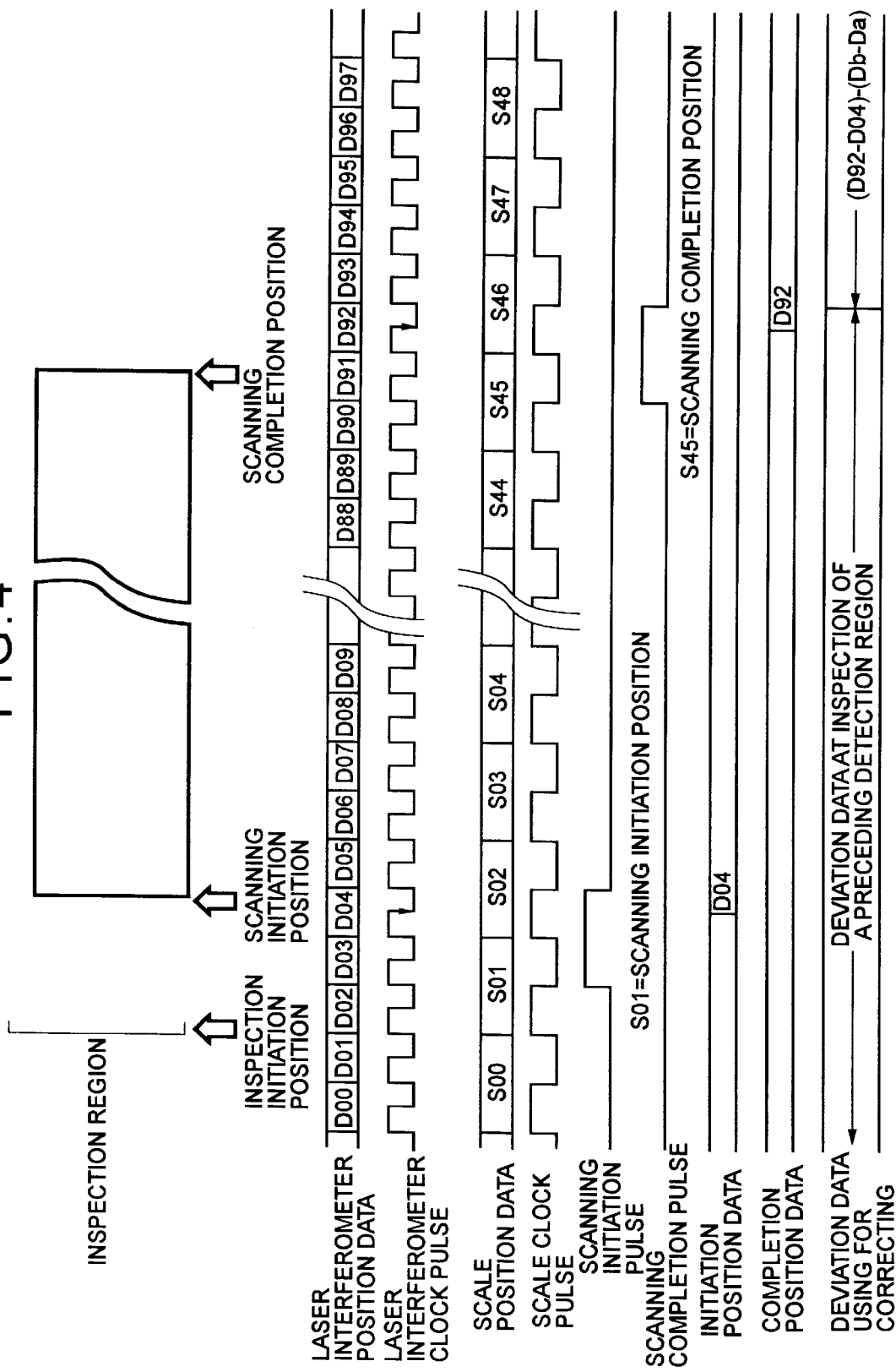
FIG. 4 is a time chart for inspecting the reticle in a method of inspecting a reticle according to the preferred embodiment of the present invention.
Figure 5:
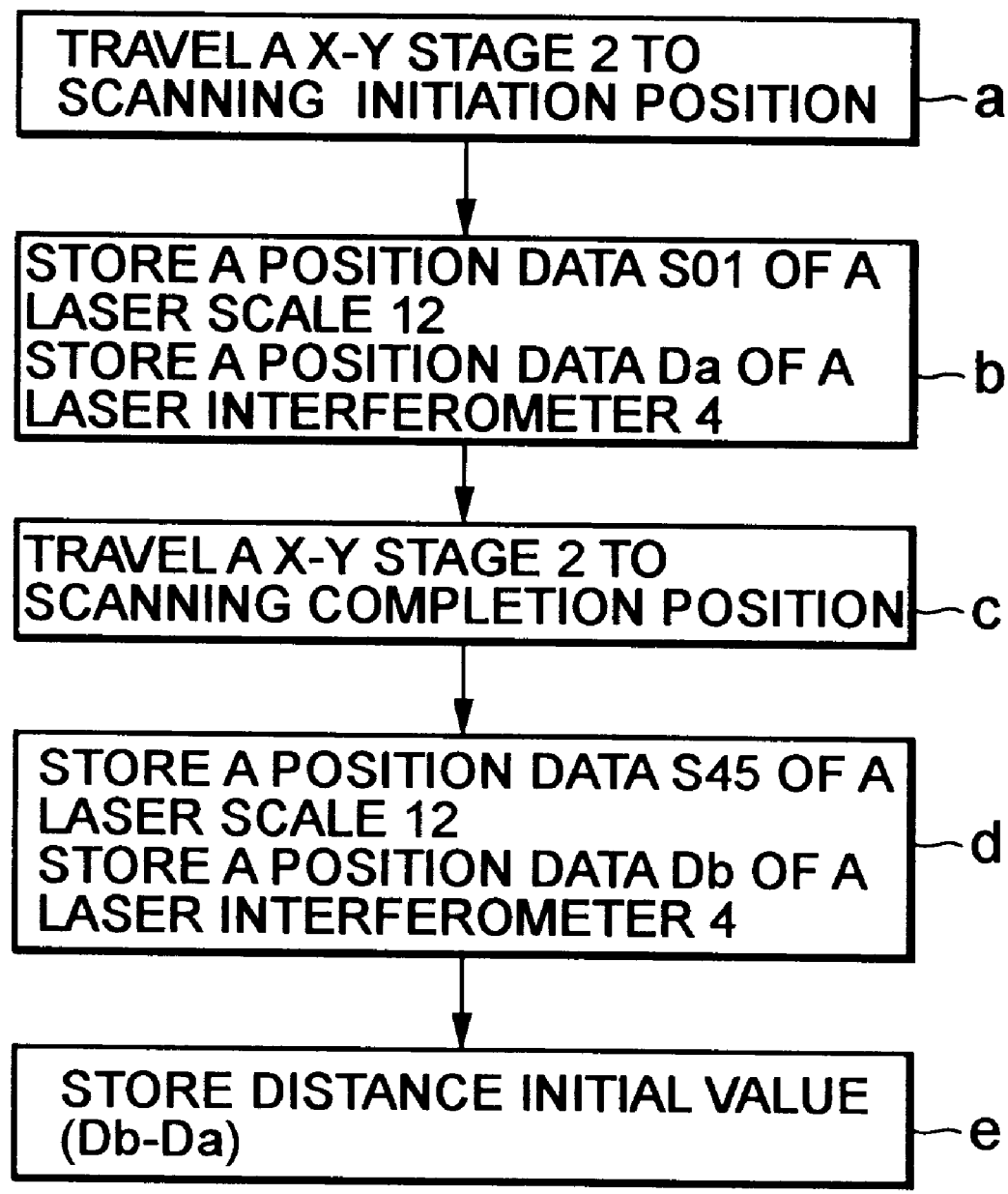
FIG. 5 is a flow chart of a preceding process of the method of inspecting a reticle according to the preferred embodiment of the present invention.
Figure 6:
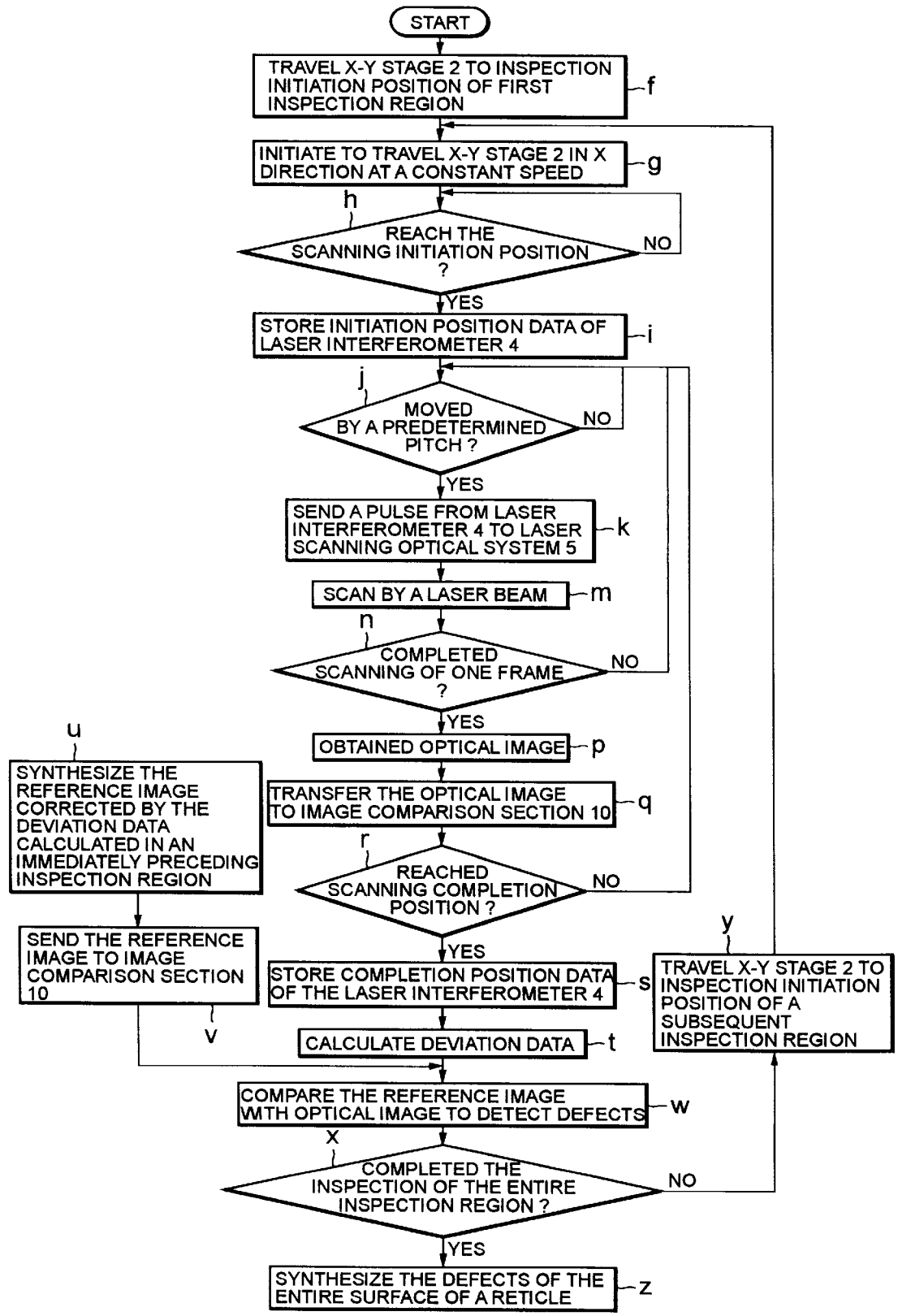
FIG. 6 is a flow chart of the reticle inspection according to the preferred embodiment of the present invention.

Now, FIG. 3 is a view illustrating the die-to-database inspection method described above. FIG. 4 is a time chart for inspection in an inspection region of the actual reticle 1. FIG. 5 is a flow chart of a preceding process of the reticle inspection method according to this embodiment. FIG. 6 is a flow chart of the reticle inspection according to this embodiment.

In this embodiment, for example, the en-tire inspection region is divided into a plurality of the inspection regions (a first to an eighth inspection regions in this embodiment) so as to overlap each other defining the direction of the x-axis as a longitudinal direction as shown in FIG. 3, to inspect from the first inspection region at every inspection region in order, and at last integrating the defects of each inspection region to inspect the entire defects of the reticle 1.

At this point, the details of the inspection in each inspection region is described as shown below. Now, prior to initiate the inspection, the data conversion section 9 takes the draft data of the reticle 1 of the inspection object to make the data into the unfolded condition in advance at each inspection region in order to synthesize the reference image. This permits synthesizing, in a short time, the reference image during inspecting.

Moreover, as shown in FIG. 5, the initial value of the distance between the laser scanning initiation position and the laser scanning completion position is measured. First, the X-Y stage 2 holding the reticle 1 is moved up to the scanning initiation position (astep "a"), and a position data SO1 (refer to FIG. 4) of the laser scale 12 and a position data Da of the laser interferometer 4 at that time are read by the deviation-delection section 13 and stored (a step "b"). Subsequently, the X-Y stage 2 is moved up to the scanning completion position (a step "c"), and again a position data S45 (refer to FIG. 4) of the laser scale 12 and a position data Db of the laser interferometer 4 are read by the deviation-detection section 13 and stored (a step "d"). At this point of time, the deviation-delection section 13 subtracts from the position data Db of the laser interferometer 4 in the scanning completion position the position data Da of the laser interferometer 4 of the scanning initiation position and stores the value (Db–Da) as the initial value of the distance (a step "e"). By the ways since scanning of the laser beam by the laser-scanning optical system 5 is executed in synchronism with a rising edge of a pulse for moving a certain pitch from the laser interferometer 4 to the laser-scanning optical system 5 described below, the position data of the laser scale which becomes a timing for scanning initiation at the inspection time is considered to be S01 and the position data of the laser scale which becomes a timing for a final scanning at the time inspection is considered to be S45.

At this point of time, the actual reticle-inspection process shown in FIG. 4 and FIG. 6. is initiated. The X-Y stage 2 holding the reticle 1 is moved up to the scanning initiation position of the first inspection region (a step "f" in FIG.6). Subsequently, the X-Y stage 2 initiates to travel at a constant speed (a step "g") in the X direction. The deviation-detection section 13 detects the position of the X-Y stage 2, and when the position data of the laser scale 12 matches with the scanning initiation position S01 stored in the preceding process and it is judged that the X-Y stage 2 reaches the scanning initiation position (a step "h"), wherein a position data D04 of the laser interferometer 4 is stored as the initiation position data at the inspection time (a step "i"), Now, when the scanning initiation position matches an inspection initiation position, the process traveling up to the scanning initiation position while monitoring the laser interferometer 4 from the inspection initiation position can be omitted.

Every time the laser interferometer 4 judges that the relative position between the position of the objective lens 3 and the position of the X-axis direction of the X-Y stage 2 is moved by a certain pitch (for example, 1 μm) (a step "j"), this laser interferometer, 4 sends to the laser-scanning optical system 5 the pause providing the instruction to move by a certain pitch (a step "k"). The laser-scanning optical system 5 scans the laser beam in the Y-axis direction every time the rising edge of this pulse (a step "m"). The laser beam scanned radiates the reticle 1 through the objective lens 3, and the transmitted light is collected through the collector lens 6 to be detected at a transmitted-light detection section 7. This scan is repeated at every certain pitch, and when it is judged that the scan of one frame is completed (a step "n"), the transmitted-light detection section 7 passes the two-dimensional optical image of the associated frame (a step "p") through an optical image input section 8 to the image comparison section 10 sequentially (a step "q").

The scan proceeds, and the deviation-detection section 13 detects the position of the X-Y stage 2, and when the position data of the laser scale 12 matches with the scanning completion position S45 stored in the preceding process and it is judged that the X-Y stage 2 to reaches the scanning completion position (a step "r"), a position data D92 of the laser interferometer 4 is stored as the completion position data at the time of this inspection (a step "s"), Subsequently, the initiation position data D04 is subtracted from a completion position data (Dg2) of the laser interferometer 4 to obtain the distance data (D92–DD4). Now, since the position data are detected by the laser interferometer 4 and the laser scale 12 responsive to respective clock pulse and the position data of the laser interferometer 4 is sent in synchronism with falling edge of the clock pulse of the laser interferometer, the position data of the laser interferometer 4 at the size of scanning initiation is considered to be D04 and the position data of the laser interferometer 4 at the time of scanning completion is considered to be D92.

From this distance data (D92–D04), the distance initial value (Db–Da) is subtracted to calculate a deviation data (D92–D04)–(Db–Da) ) (a step "t") and send to the data conversion section 9. Although the position data of the laser scale (for example, S01 and S45) is hardly affected by the changes in the environment, and the sane position could substantially be indicated at all time, it is considered that the reason why the distance data of the laser interferometer 4 (D92–D04) differs from the distance initial value (Db–Da) is as a consequence of it being affected by the changes in the environment. Thus a deviation is caused in the detected results of the laser interferometer 4. That is to say, the optical image obtained would be expanded and contracted by this deviation data ((D92–D04)–(Db–Da)).

On the other hand, the data conversion section 9 synthesizes the reference image every one fraze in real time from the intermediate data unfolded in the preceding process described above (it step "u") to send to the image comparison section 10 (a step "v"). At this time, the synthesized reference image is corrected accurately based in the deviation data sent after being minimized. By the way, the deviation data used in this correction is the deviation data obtained at inspection of the inspection region preceding by one of the associated inspection region. For example, the devlation data used for correcting when inspecting the third inspection region is the data obtained when inspecting the second inspection region. However, although there is no deviation data to be used for correcting with respect to the first inspection region, it is assumed that a large error is not yet caused and is thus corrected.

Therefore, the image comparison section 10 compares the optical image entered from the optional image input section 8 with the ready-to-correct optical image entered from the data conversion section 9 at every frame to detect the defect (a step "w").

As described above, a visual inspection of the reticle 1 is performed with respect to one inspection region. This inspection process is performed over the entire inspection region of one sheet of the reticle 1. If inspection of the entire inspection region is not completed (a step "x"), the X-Y stage 2 is moved to the inspection initiation position of the subsequent inspection region (a step "y"), the steps "g" to "x" are executed with respect to the subsequent inspection region. Moreover, when the inspection of the entire inspection region is completed (a step "x"), the inspected results of each inspection region are synthesized to obtain the defects of the entire surface of the reticle 1 (a step "z") and to output to a display means or the like (not shown) from the image comparison section 10.

Thus, by correcting using the laser scale 12 being hardly affected by the changes in the environment, the visual inspection of tile reticle can be performed with a high accuracy.

Although the position-detection resolution and the repeat accuracy of the laser scale 12 are substantially 0.01 μm, and is less by one order of magnitude as compared with the laser interferometer 4, the pitch of scanning is substantially 0.1 μm, so is no problem.

Moreover, although a method for detecting, the position of the x-axis by only the laser scale 12 also can be thought without using the laser interferometer 4, in general, the objective lens 3 is oscillated with a different phase from one of the X-Y stage 2, whereby as far as this oscillation is canceled by means of the laser interferometer 4, a defect detection can not be performed with a high accuracy. Therefore, the use in combination of the laser interferometer 4 and the laser scale is required.

In the interim, in order to obtain the optical irate of the reticle 1, as a substitute of using the combination of the laser-scanning optical system 5 and the transmitted-light detection section 7, the combination of a mercury lamp and CCD line sensor or the like also can be used.

As described above, according to the invention, by calculating, the measurement error of the laser interferometer accompanying with the charges in the environment using the scale which is hardly affected by the changes in the environment and synthesizing the reference image corrected by the error thereof to compare with the optical image, the reticle can be inspected accurately. In particular, since the error of the laser interferometer 4 is monitored always to be fed-back for synthesizing of the reference image in inspection of the next time, it can be corresponded even in the case that the change in the environment goes on, thereby an inspection performance with a high accuracy is able to be maintained. Moreover, a very large temperature control chamber and the wavelength compensator are not required, thereby the entire system is able to be made compact and to be reduced in price. Furthermore, it can be manufactured simply and inexpensively by adding the scale to the conventional constitution.

Moreover, the change in the environment is not detected by an indirect measuring method such as the compensator, but the distance which the stage actually travels is detected by two kinds of methods of the laser interferometer and the laser scale to obtain the deviation, whereby taking advantages of the both characteristics, the reference image appropriately corrected can be obtained and inspected accurately.

While the present invention has thus far been described in conjunction with only a preferred embodiment thereof, it will now be readily possible for one skilled in the art to put the present invention into effect in various other manners.

What is claimed is:

1. A method of inspecting a reticle comprising the steps of:

irradiating a light beam on a reticle having a pattern, said reticle receiving the transmitted light to form an optical image, while moving an X-Y table holding said reticle to measure the relative position of the X-Y table by a laser interferometer;

comparing the optical image with a reference image synthesized by converting draft data used when forming said pattern; and detecting defects of said pattern;

providing a scale to which changes in an environmental condition is less than that of said laser interferometer to detect the position of the X-Y table, obtaining deviation data of measurement errors of said laser interferometer due to the changes in the environmental condition, using the scale for successive, overlapping inspection regions of said reticle;

converting said draft data by an amount of said deviation data to produce corrected draft data for said successive, overlapping inspection regions; and synthesizing said reference image for a given inspection region from said corrected draft data of a preceding inspection region.

2. A method as claimed in claim 1, wherein said deviation data is calculated by:

storing position data of the laser interferometer and the scale in a light-beam irradiating initiation position, and position data of the laser interferometer and the scale in a light-beam irradiating completion position; calculating an initial distance value of the difference between said position data of the laser interferometer in said light-beam irradiating completion position and said position data of the laser interferometer in said light-beam irradiating initiation position;

moving the X-Y table, on which the reticle is placed, so that the position data detected by said scale matches with the position data of said light-beam irradiating initiation position and storing said initiation position data of the laser interferometer at that time;

subsequently, initiating said light-beam irradiation to said reticle while moving said X-Y table;

storing said completion position data of the laser interferometer and stopping said light-beam irradiating, at the time in which the position data detected by the scale reaches said light-beam irradiating completion position; and calculating a distance data of the difference between said completion position data of the laser interferometer and said initiation position data of the laser interferometer and calculating difference data between the distance data and said initial distance value; and utilizing said difference data as said deviation data.

3. A method as claimed in claim 1, wherein said laser interferometer cancels vibrations different in phase between a lens of a laser-scanning optical system irradiating said light beam and said X-Y table.

4. A method as claimed in claim 1, wherein said scale is a laser scale.

5. A method as claimed in claim 1, wherein said light beam is a laser beam.

6. A reticle inspection system comprising:

an X-Y table for carrying a reticle on which the pattern is formed;

a light beam-scanning optical system for irradiating a light beam on said reticle;

a laser interferometer for measuring a relative position of the X-Y table;

a scale to which changes in an environmental condition is less than that of said laser interferometer, said scale for measuring the position of said X-Y table;

a transmitted-light detection section for obtaining an optical image based on the transmitted light of said light beam which is irradiated on said reticle;

a data conversion section for obtaining deviation data of a measurement error due to the changes in the environmental condition of said laser interferometer using said scale for successive, overlapping inspection regions of said reticle, to synthesize the reference image corrected for a given inspection region by said deviation data determined for a preceding inspection region from draft data used when forming said pattern; and an image comparison section for comparing said optical image with said reference image to detect defects of said pattern.

7. A reticle inspection system as claimed in claim 6, wherein said deviation data are the difference between an initial distance value being the difference between a completion position data and an initiation position data measured before said laser interferometer is affected by changes in the environmental condition, and the distance data being the difference between the completion position data and the initiation position data measured after said laser interferometer is affected by the changes in the environmental condition.

8. A reticle inspection system as claimed in claim 6, wherein said laser interferometer cancels vibrations different in phase between a lens of a laser-scanning optical system for irradiating said light beam and said X-Y table.

9. A reticle inspection system as claimed in claim 6, wherein said scale is a laser scale.

10. A reticle inspection system as claimed in claim 6, wherein said light beam is a laser beam.

* * * * *